United States Patent [19]
Nishiguchi

[11] Patent Number: 5,461,261
[45] Date of Patent: Oct. 24, 1995

[54] SEMICONDUCTOR DEVICE WITH BUMPS

[75] Inventor: Masanori Nishiguchi, Yokohama, Japan

[73] Assignee: Sumitomo Electric Industries, Ltd., Japan

[21] Appl. No.: 358,979

[22] Filed: Dec. 19, 1994

Related U.S. Application Data

[63] Continuation of Ser. No. 50,596, Apr. 22, 1993, abandoned.

[30] Foreign Application Priority Data

May 6, 1992 [JP] Japan ................... 4-113570

[51] Int. Cl.⁶ .................. H01L 23/48; H01L 29/46; H01L 29/62; H01L 29/64
[52] U.S. Cl. .................. 257/781; 257/780; 257/737
[58] Field of Search ................... 257/777, 778, 257/779, 780, 781, 784, 786, 737, 738

[56] References Cited

U.S. PATENT DOCUMENTS

| | | | |
|---|---|---|---|
| 3,392,442 | 7/1968 | Napier et al. | 257/779 |
| 3,508,118 | 4/1970 | Merrin et al. | 257/779 |
| 3,959,522 | 5/1976 | Ladney et al. | 257/779 |
| 3,986,255 | 10/1976 | Mandal | 257/781 |
| 4,673,772 | 6/1987 | Satoh et al. | 257/779 |
| 4,875,617 | 10/1989 | Citowsky . | |
| 4,922,322 | 5/1990 | Mathew | 257/779 |
| 5,197,654 | 3/1993 | Katz et al. | 228/123.1 |

FOREIGN PATENT DOCUMENTS

| | | |
|---|---|---|
| 073383 | 3/1983 | European Pat. Off. . |
| 382080 | 8/1990 | European Pat. Off. . |

*Primary Examiner*—Sara W. Crane
*Assistant Examiner*—S. V. Clark
*Attorney, Agent, or Firm*—Beveridge, DeGrandi, Weilacher & Young

[57] ABSTRACT

The semiconductor chip is provided with bumps each formed by alternately building up two types of metal materials capable of forming an eutectic alloy, and, therefore, an eutectic alloy reaction takes place at each boundary surface between two layers. The entire bump fully melts in the reaction so that the semiconductor chip may be securely connected on the substrate.

15 Claims, 8 Drawing Sheets

SEMICONDUCTOR DEVICE WITH BUMPS

This application is a continuation, of application Ser. No. 08/050,596, filed Apr. 22, 1993, which application is entirely incorporated herein by reference, now abandoned.

BACKGROUND OF THE INVENTION

1. Field of the Invention

The present invention relates to a semiconductor device having bumps for connection between a semiconductor chip and an external electrode.

2. Related Background Art

The wireless bonding is a method for connecting all pads on a semiconductor chip to external terminals by respectively associated bumps, which includes the flip chip method and the TAB (Tape Automated Bonding) method.

FIG. 1 is a cross section to show a structure of a conventional semiconductor chip on which a Au (gold) bump is formed. The conventional semiconductor chip is formed by depositing a Ti (titanium)-W (tungsten) alloy 32 on an Al (aluminum) pad 31, a Au layer 33 on the Ti—W alloy 32, and a Au bump 34 on the Au layer 33 by electroplating. A bump forming process is described for example in Reference "Semiconductor Fabrication Technology Handbook" (handoutai-jissou-gijyutsu Handbook), Chapter 2, Section 9, p.128–138, Flip Chip Bonding, Author. Soga Fusao, Sept., 1986.

Incidentally, the mounting (packaging) method using the Au—Sn (gold-tin) eutectic method is such that Sn is deposited by plating on a pad on an external electrode and the Au—Sn eutectic alloy reaction is undergone between the pad and an associated Au bump on semiconductor chip, whereby a surface portion of Au bump melts to effect connection therebetween.

The Au—Sn eutectic alloy reaction, however, takes place only at a contact surface between the Au bump and the Sn plating layer on the pad. Accordingly, if Au bumps on a semiconductor chip have a disparity in height thereof, there would remain some Au bumps not contacting with corresponding pads, resulting in defective contact therebetween. FIG. 2 shows a state of an Au bump in defective contact with an opposing pad. FIG. 2 shows an example in which a semiconductor chip 42 is mounted on a wiring substrate 41. Since a bump 44 is not in contact with a Sn plating 47 on a pad 46, no Au—Sn eutectic alloy reaction takes place at the surface of the bump 44, whereby resulting in defective contact therebetween.

SUMMARY OF THE INVENTION

The conventional semiconductor device has a problem of low yield in mounting of the semiconductor chip due to defective contacts. It is an object of the present invention to solve such a problem.

To solve the above problem, a bump is formed by alternately building up two types of metal materials capable of making an eutectic alloy.

That is, a bump-formed semiconductor chip according to the present invention comprises:

a semiconductor chip on which semiconductor elements are formed; and a bump electrically connected with a semiconductor element formed on the semiconductor chip;

wherein said bump comprises a layer made of a first metal material and a layer made of a second metal material capable of eutectically reacting with said first metal material.

A bump-formed wiring member according to the present invention comprises:

a wiring member electrically connected with a semiconductor element formed on a semiconductor chip in which desired wiring is formed of a conductor; and a bump electrically connected with the wiring;

wherein said bump comprises a layer made of a first metal material and a layer made of a second metal material capable of eutectically reacting with said first metal material.

A semiconductor device according to the present invention comprises:

a semiconductor chip on which semiconductor elements are formed;

a bump electrically connected with a semiconductor element selected from said semiconductor elements; and an external electrode electrically connected with said bump;

wherein the bump comprises a layer made of a first metal material and a layer made of a second metal material capable of eutectically reacting with the first metal material.

According to the mounting method of the semiconductor chip of the present invention, there are bumps formed by alternately building up the two types of metal materials capable of forming a eutectic alloy, so that the eutectic alloy reaction takes place at each boundary surface between layers. Melting of each boundary surface between layers may fully soften the entire bump. Then, an external electrode (semiconductor chip) will moderately encroach on a bump with press bonding, absorbing unevenness of bump height on the semiconductor chip (external electrode) and a deviation in parallel among the semiconductor chip, the external electrode, and the bumps. In other words, a moderate pressure application can assure reliable connection of a semiconductor chip on the substrate.

In the present invention as described, the connection is made using the eutectic alloy reaction, whereby mounting can be carried out with less damage. Also, the mounting method of the present invention is not so sensitive to bump height dispersion, so that the yield in mounting may be improved.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art form this detailed description.

DESCRIPTION OF THE PREFERRED EMBODIMENTS

Figure 1:
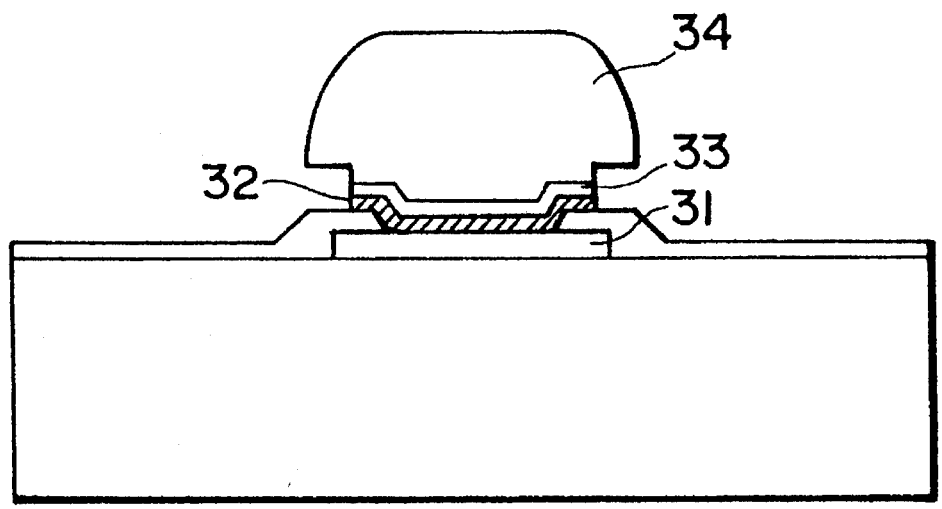
FIG. 1 is a cross section of a semiconductor chip with a conventional bump structure.
Figure 2:
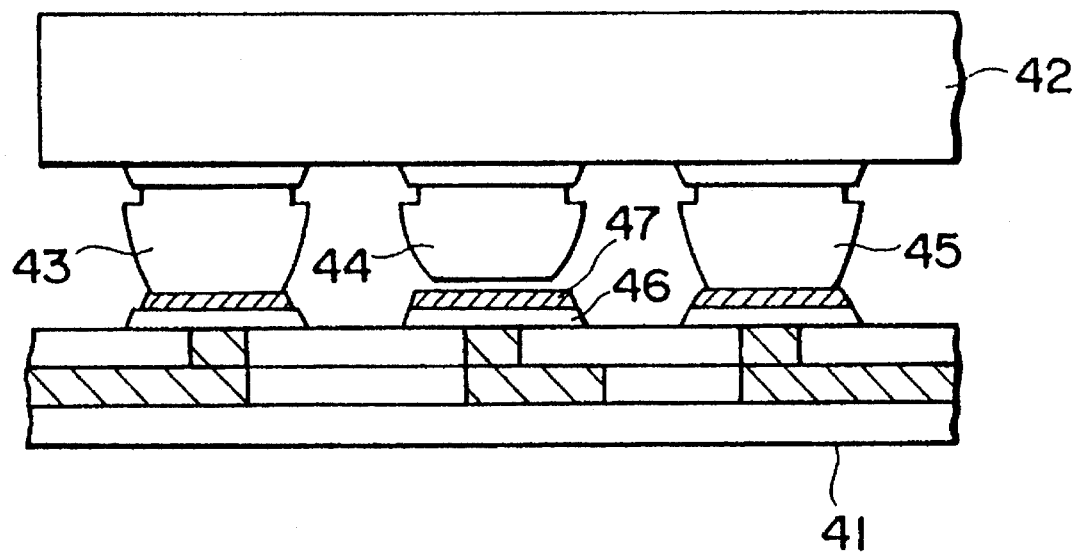
FIG. 2 is a cross section of a semiconductor device in which a semiconductor chip with the conventional bump structure is mounted.
Figure 3:
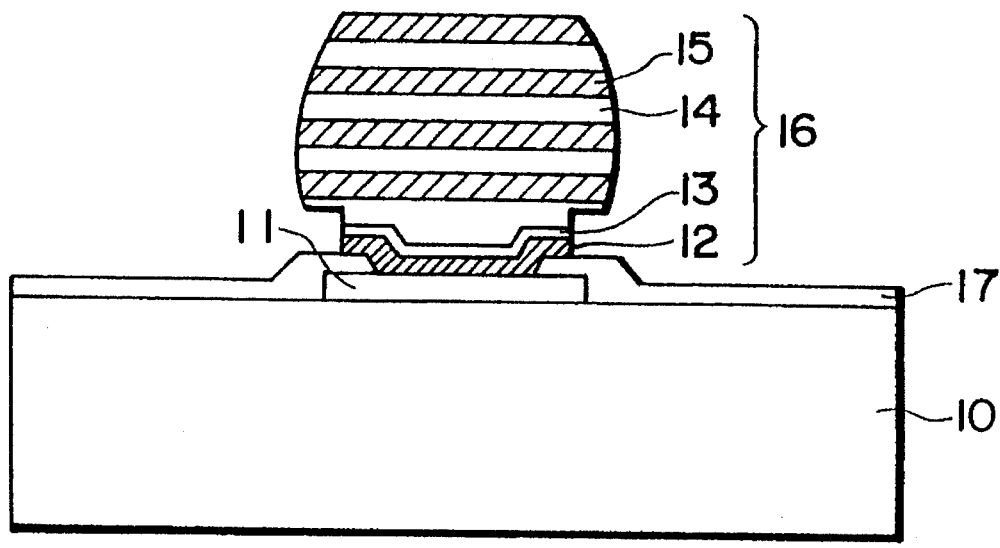
FIG. 3 is a cross section of a semiconductor chip with a bump structure according to the present invention.
Figure 4:
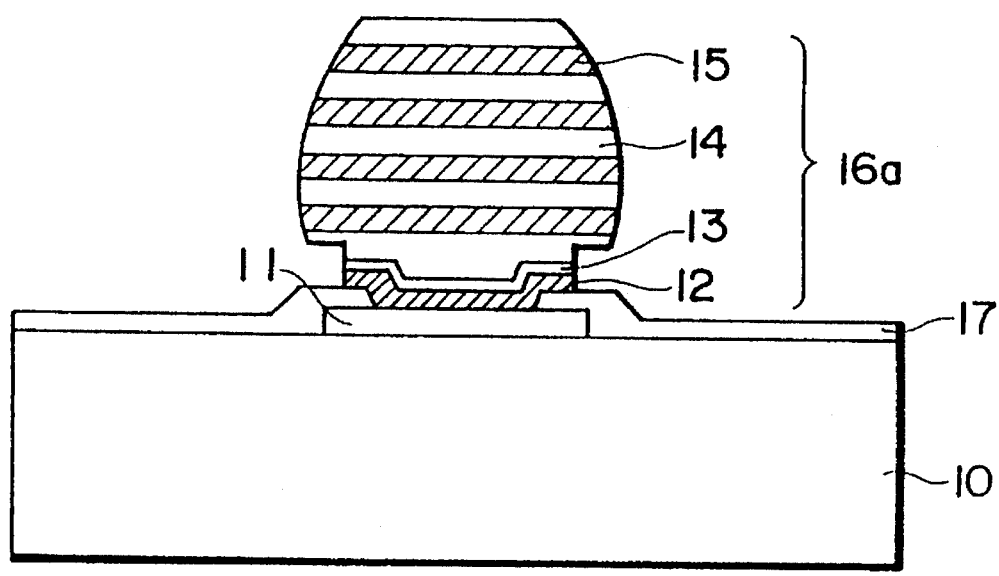
FIG. 4 is a cross section of a semiconductor chip with another bump structure according to the present invention.

An embodiment of the present invention is described below with reference to the accompanying drawings. FIG. 3 is a schematic cross section to show a structure of a semiconductor chip in the present embodiment. In the present embodiment, a Ti—W alloy 12 is formed on an Al pad 11 on a semiconductor chip 10, securing adherence to the Al pad 11 and serving as a barrier metal to prevent the Al pad 11 and a Au contact layer 13 from forming an intermetallic compound in heat during connection therebetween. The Au contact layer 13 is formed on the Ti—W alloy 12, which assures superior plating feasibility in plating of upper Au layer 14 thereon and keeping adherence to the Ti—W alloy 12. A protective layer 17 such as SiN covers an area except for the Al pad 11 on the semiconductor chip 10. Au layers 14 and Sn layers 15 are alternately built up on the Au contact layer 13 by the electroplating method. A multilayered bump 16 is composed of the Au layers 14 and the Sn layers 15. As shown in FIG. 4, the uppermost layer in the bump 16a does not always have to be the Sn layer 15, but may be a Au layer 14. In this case, if the uppermost Au layer 14 is sufficiently thin, the uppermost Au layer 14 would melt by the Au—Sn eutectic alloy reaction during mounting, which allows sure connection with a moderate pressure. In case that the uppermost Au layer 14 is formed too thick to wholly melt, Sn plating should be provided on a tape or electrode pad. In the present embodiment, the electroplating method is used for formation of the Sn layer 15, but the vacuum evaporation method may also be employed for deposition of Sn layer 15 (in thickness of 0.1–2.0 μm).

Since the bump 16 is formed by alternately building up the Au layers and the Sn layers in the present embodiment as described, the Au—Sn eutectic alloy reaction may take place at each boundary surface between layers in mounting. Then, the entire bump 16 may fully soften. Even if a plurality of bumps provided on a semiconductor chip have a slight disparity in bump height, secure connection may be obtained with the application of moderate pressure.

The bumps are formed on the semiconductor chip in the above description, but the bumps may also be formed on an external electrode such as a wiring (circuit) substrate or a tape used in the TAB method.

Figure 5:
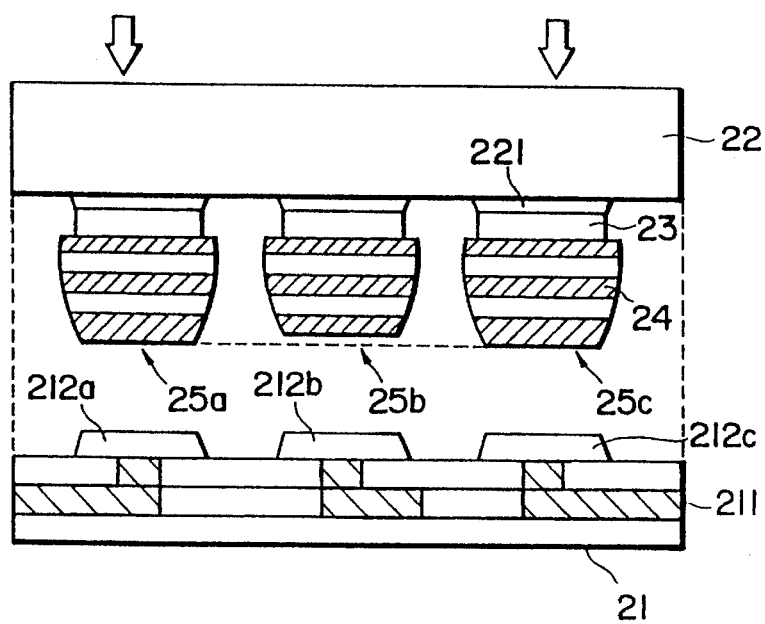
FIG. 5, FIG. 6, and FIG. 7 are drawings to show steps in the flip chip mounting method in which a semiconductor chip with the bump structure according to the present invention is to be mounted onto a substrate.
Figure 6:
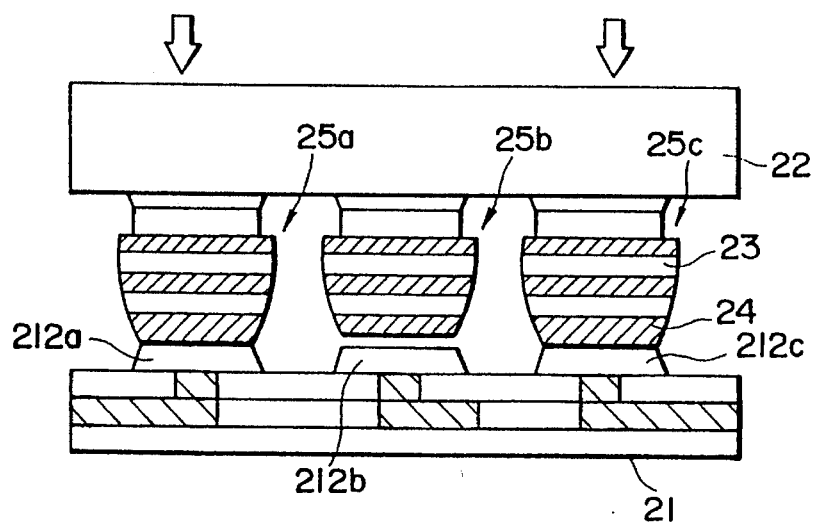
Figure 7:
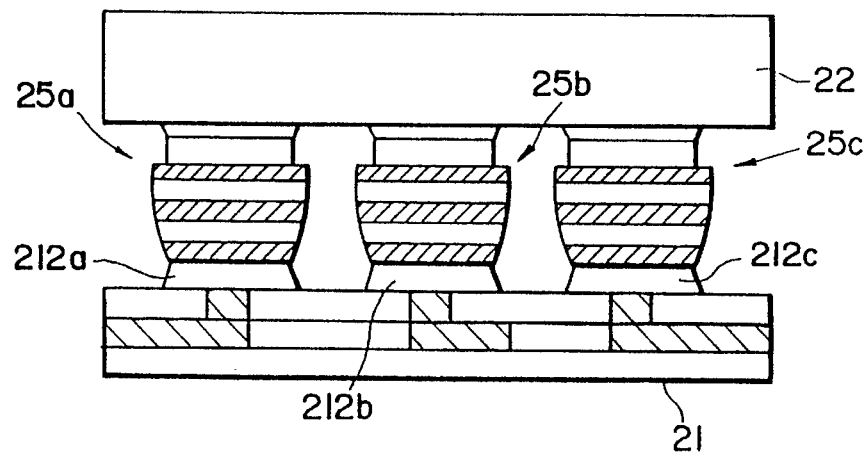

FIG. 5 to FIG. 7 show steps of mounting in the flip chip mounting method. In these drawings, the Ti—W alloy 12, the Au contact layer 13, and the protective layer 17 as shown in FIG. 3 and FIG. 4 are omitted.

A wiring substrate 21 has a conductor portion 211 of desired pattern and three wiring side pads 212a, 212b, 212c connected therewith and made of Au. Also, three bumps 25a, 25b, 25c are formed on pads 221 of a semiconductor chip 22. Each of these bumps 25a–25c is formed by alternately building up three Au layers 23 and three Sn layers 24 (six layers in total). The uppermost layer (as turning the semiconductor chip 22 upside-down, the lowermost layer in FIG. 5 to FIG. 7.) in each bump 25a–25c is the Sn layer 24.

The wiring substrate 21 is first placed under the semiconductor chip 22, and the semiconductor chip 22 is located with the bumps 25a–25c face down. The semiconductor chip 22 is aligned with the wiring substrate 21 such that the bumps 25a–25c may contact with corresponding wiring side pads 212a–212c, and the semiconductor chip 22 is then pressed. FIG. 5 shows a step before the bumps 25a–25c come into contact with the wiring side pads 212a–212c.

FIG. 6 shows a step at which the bumps 25a and 25c on either end are in contact with the corresponding wiring side pads 212a and 212c but the shorter bump 25b is not in contact with the wiring side pad 212b.

In the conventional method, the Au—Sn eutectic reaction takes place only in the interface portion between the tip of bump and the wiring side pad, and, therefore, this step is the end of process, leaving the bump 25b as defective in contact. In contrast, the Au—Sn eutectic reaction takes place not only in the interface between the bump tip and the wiring side pad but also at each boundary surface between layers in a bump (in this case, 6 surfaces in total), fully softening the entire bump in the present invention. Thus, the bump 25b may be brought into contact with the wiring side pad 212 as shown in FIG. 7.

Figure 8:
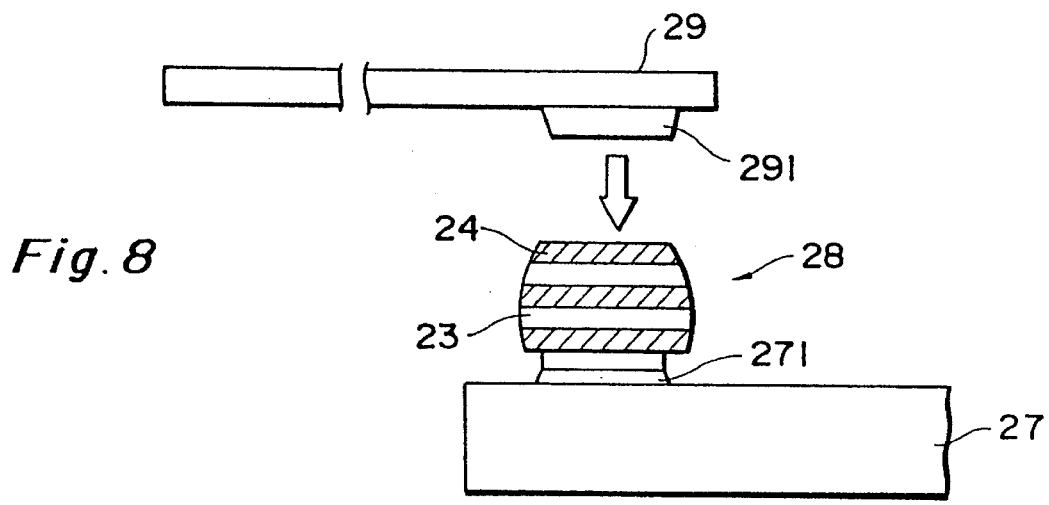
FIG. 8, FIG. 9, and FIG. 10 are drawings to show steps in the TAB method in which a semiconductor chip with the bump structure according to the present invention is to be mounted onto a substrate.
Figure 9:
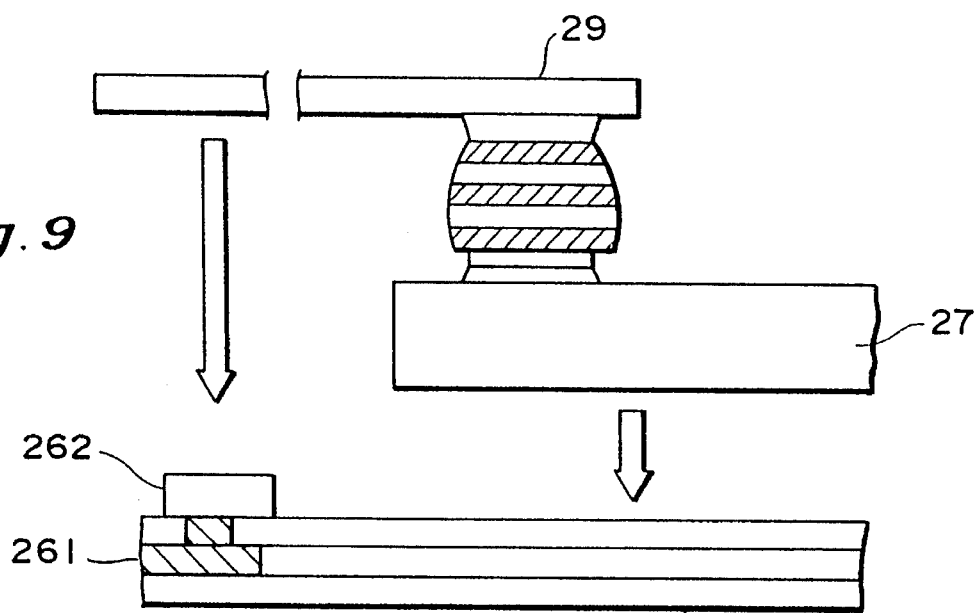
Figure 10:
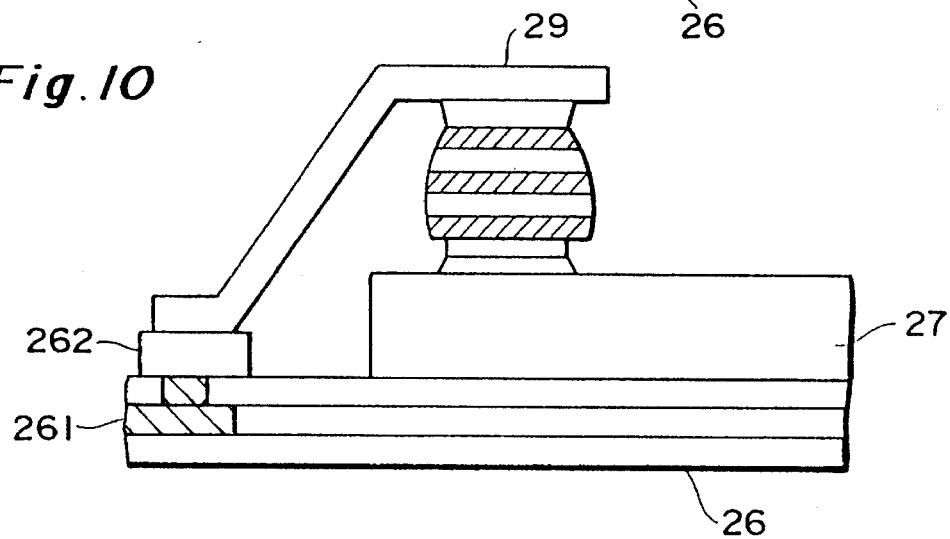

FIG. 8 to FIG. 10 show steps of mounting a semiconductor chip on a printed circuit board by the TAB method. In these drawings, the Ti—W alloy 12, the Au contact layer 13, and the protective layer 17 as shown in FIG. 3 and FIG. 4 are omitted.

A lead frame 29 formed in tape has at one end thereof a lead frame side pad 291 made of Au. A bump 28 is formed on a pad 271 of a semiconductor chip 27. The bump 28 is formed by alternately building up three Au layers 23 and three Sn layers 24 (six layers in total). The uppermost layer in the bump 28 is the Sn layer 24.

The lead frame 29 is first set above the semiconductor chip 22 with the lead frame side pad 291 face down, and the semiconductor chip 22 is set with the bump 28 face up. The lead frame side pad 291 is aligned to contact with the corresponding bump 28, and the lead frame 29 is then pressed. FIG. 8 shows a step before the bump 28 comes into contact with the lead frame side pad 291.

FIG. 9 shows a state in which the bump 28 is in contact with the lead frame side pad 291 and is securely connected therewith by the eutectic reaction. Also, in case that a plurality of bumps are simultaneously bonded in the TAB method, the defective contact of bump may be eliminated in the same manner as described with the process in the flip chip mounting method. In case that the uppermost layer of the bump 28 is a Au layer instead of Sn layer, Sn plating must be preliminarily provided on the lead frame side pad 291.

Then, the semiconductor chip 27 electrically connected with the lead frame 29 is mounted on a printed circuit board 26. The printed circuit board 26 has a conductor portion 261 of desired pattern and a wiring side pad 262 connected therewith. The mounting is made by soldering of the other end of the lead frame 29 onto the wiring side pad 262, ending in the state as shown in FIG. 10.

Next explained is the structure of bump characteristic in the present invention, including the height of bump, materials of the respective layers, the number of the respective layers, and so on.

The materials used for bump may be any two types of metals capable of undergoing the eutectic reaction. Specifically, in addition to the combination of Au and Sn as described, the following combinations may be listed up as examples of the materials for bump. The Au series includes combinations of base constituents such as Au:Si, Au:Ge, Au:In, Au:Sb, Au:Ga, and Au:Pb. Also, the Ag series includes combinations of base constituents such as Ag:Cu into which Zn, Ni, and/or Cd are added. Further, the In series includes combinations of base constituents such as In:Sn, In:Ag, and In:Pb.

The height of the entire bump changes depending upon various conditions of semiconductor chip and others (area, the number of bumps bonded, etc.), usually 10–300 μm. The height of bump is not limited to this range.

As for the number of layers in bump, the more the easier the entire bump softens, but the minimum number is one layer for each of the two types of metals capable of undergoing the eutectic reaction. In actual application, the number of layers must be increased as the height of the entire bump and the dispersion thereof become greater. In case that the height of the entire bump is below 300 μm, 3–30 layers are suitable for each metal, taking into consideration readiness of process in bump formation, preferably 3–10 layers.

A ratio of thicknesses of two metal layers does not have to be 1:1 (need not be identical to each other), but should rather be determined considering an operation temperature (that is, eutectic temperature) in bonding process. For example, in case of Au:Sn, Sn has a lower melting point than Au. Therefore, an increase of Sn in ratio increases a melt part in bump at a lower temperature. It is preferable that Au:Sn be set at 5:1 to 10:1 in actual applications.

A process for forming a bump is next explained.

Figure 11:
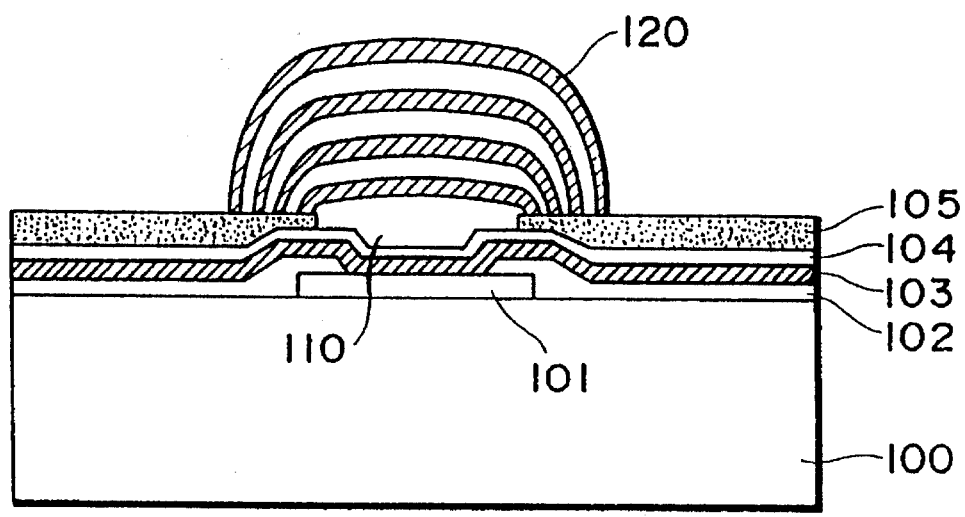
FIG. 11 and FIG. 12 are drawings to show a method for forming a bump by electroplating.
Figure 12:
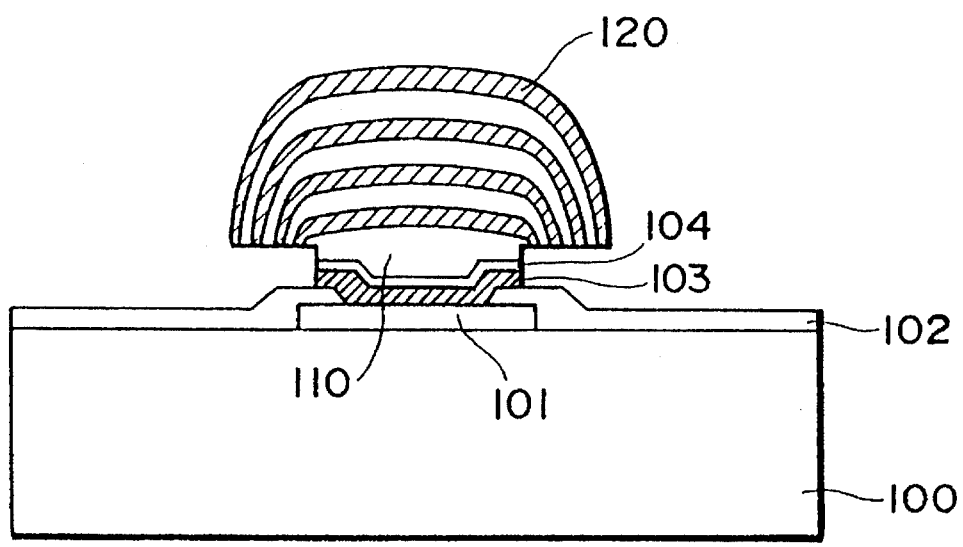

FIG. 11 and FIG. 12 show a first bump forming method in which a bump is formed using the electroplating method similar to the technique as described in the aforementioned semiconductor fabrication handbook.

The reference shows a bump made only of Au, and, therefore, the bump of the present embodiment is different from that in the reference in that the bump is multilayered with alternate Au and Sn.

An Al pad 101 is formed in a desired area on a semiconductor chip 100 in which semiconductor elements are formed, and a protective layer 102 made of SiN is further formed over the area excluding the Al pad 101 on the semiconductor chip 100.

Then, a Ti—W alloy layer 103 and a Au contact layer 104 are consecutively deposited over the entire area by evaporation. A photoresist is then applied over the entire surface, and a window for bump formation is opened by the photolithography process.

An Au layer 110 is then formed having a thickness of 18 μm by electroplating. A Sn layer 120 is next formed having a thickness of 2 μm by electroplating. These formation steps of the Au layer 110 and the Sn layer 120 are consecutively repeated to form a bump with a desired height (FIG. 11).

After that, the photoresist 105 is removed, and the evaporation layers (Ti—W alloy layer 103 and Au contact layer 104) are removed except underneath the bump by chemical etching (FIG. 12).

In FIG. 12, the Au layers 110 and the Sn layers 120, four layers each, are formed in bump height of 80 μm. In case that there are 300–500 bumps in LSI, the bump height must be about 200 μm, and, therefore, the Au layers 110 and the Sn layers 120 are to be formed in ten layers each.

Figure 13:
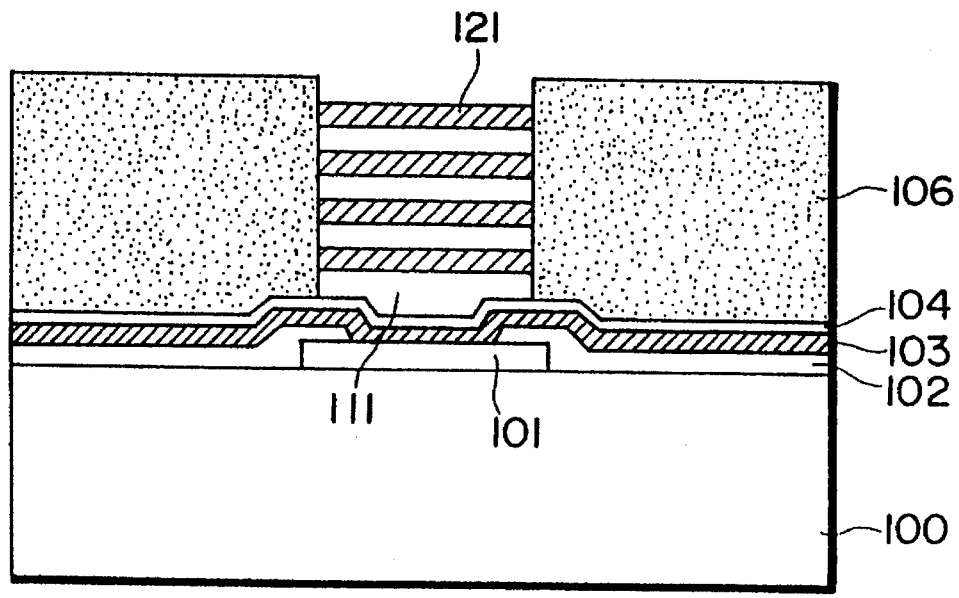
FIG. 13 and FIG. 14 are drawings to show a method for forming a bump while using a sheet resist and the electroplating.
Figure 14:
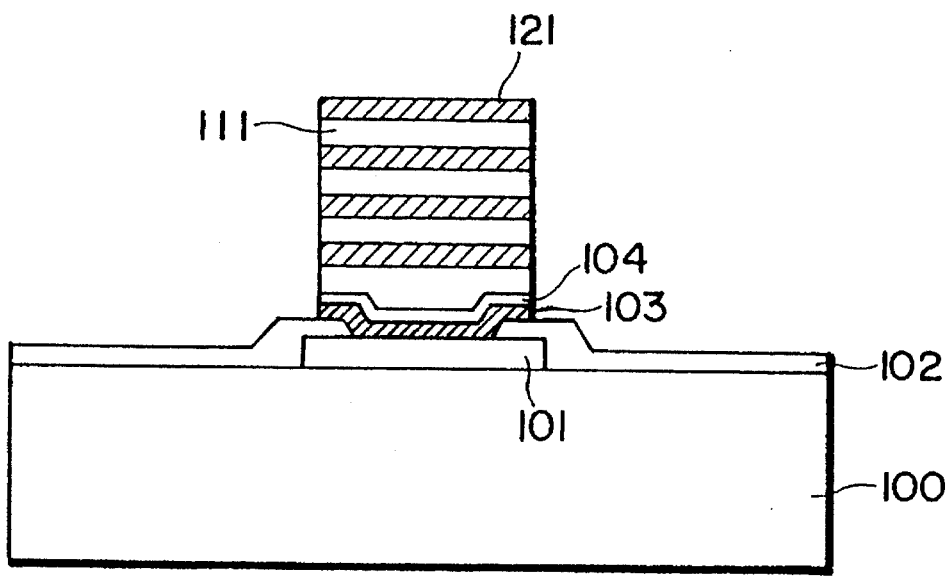

Since the plating layer is formed thicker than the photoresist layer in the above process, the bump is likely to be formed in "mushroom" shape. FIG. 13 and FIG. 14 show a second bump forming method, in which the bump is formed with a thicker photoresist to prevent the horizontal mushroom-like extent of plating layer.

Steps up to the evaporation of the Au contact layer 104 are the same as those in the first bump forming method as described above. A photoresist 106 of sheet dry film is provided (in thickness of not less than 30 μm) in place of liquid photoresist. A window for bump formation is opened by the photolithography process, and Au layers 111 and Sn layers 121 are alternately formed by electroplating (FIG. 13).

After that, the photoresist 106 is removed, and the evaporation layers (Ti—W alloy layer 103 and Au contact layer 104) are removed except underneath the bump by chemical etching (FIG. 14).

Figure 15:
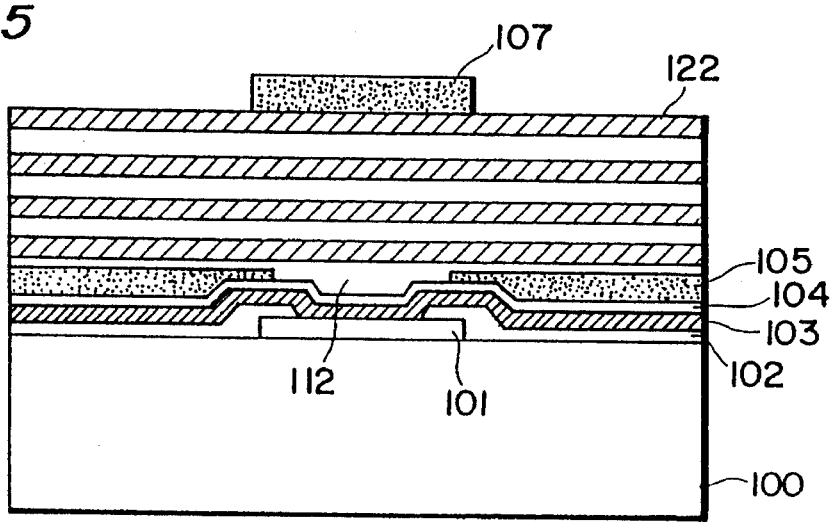
FIG. 15, FIG. 16, and FIG. 17 are drawings to show a method for forming a bump by the evaporation method.
Figure 16:
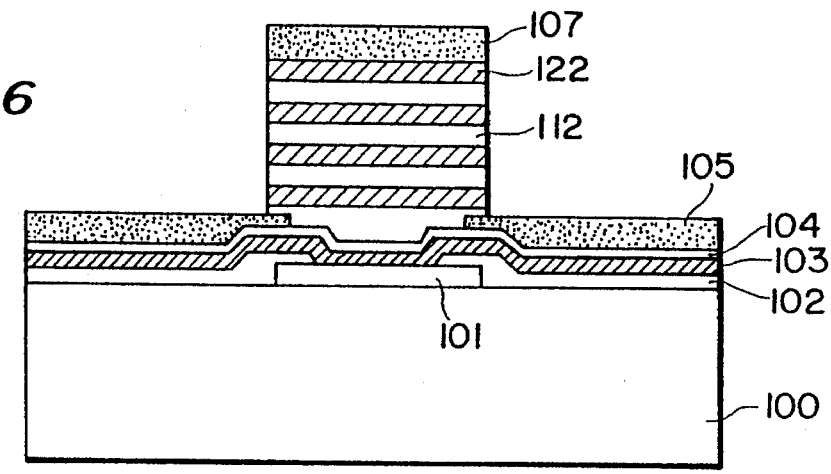
Figure 17:
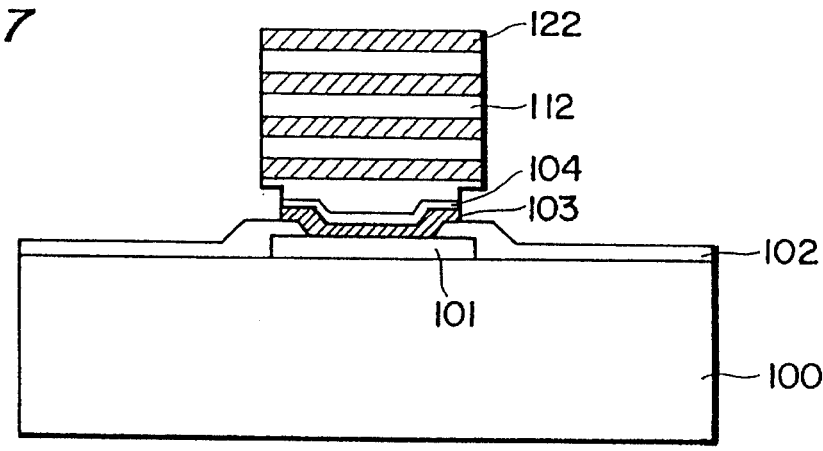

FIG. 15 to FIG. 17 show a third bump forming method, in which a bump is formed by evaporation. Steps up to the window opening for bump formation are the same as those in the first bump forming method as described. After the window opening, Au layers 112 and Sn layers 122 are alternately deposited by the evaporation method. Further, a photoresist 107 is formed on an area under which a bump is to be formed (FIG. 15). Unnecessary portions of the Au layers 112 and the Sn layers 122 are removed with the photoresist 107 serving as a mask (FIG. 16).

After that, the photoresists 105 and 107 are removed, and the evaporation layers (Ti—W alloy layer 103 and Au contact layer 104) are removed except underneath the bump by chemical etching (FIG. 17).

Figure 18:
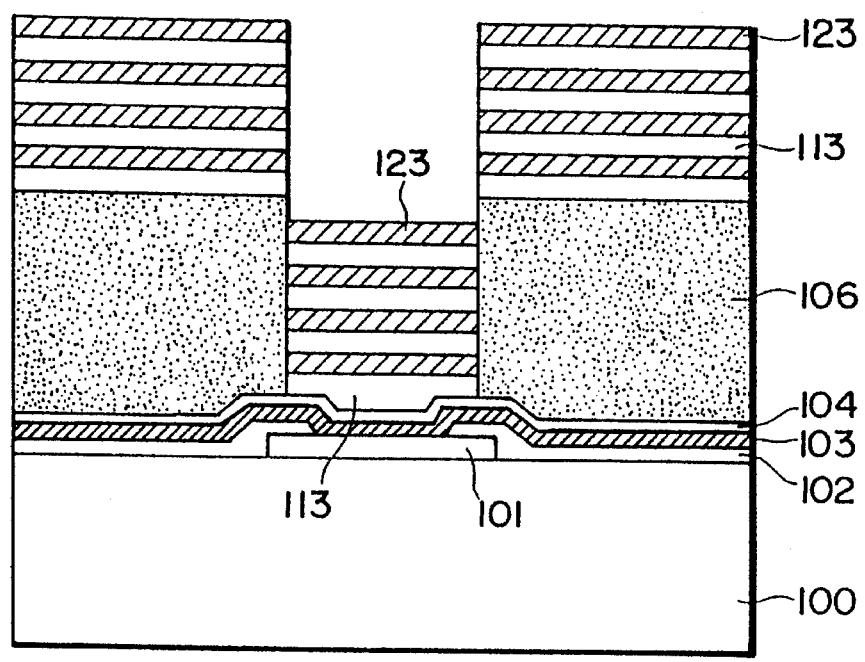
FIG. 18 and FIG. 19 are drawings to show a method for forming a bump while using a sheet resist and the evaporation method.
Figure 19:
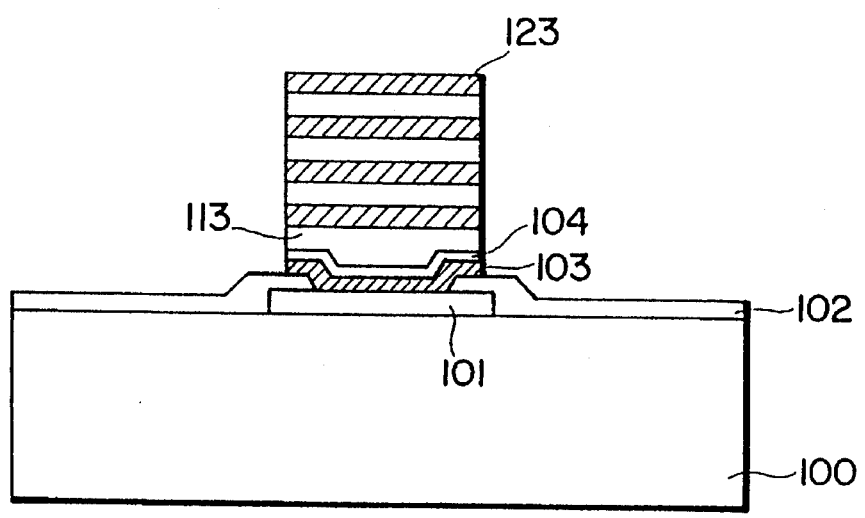

FIG. 18 and FIG. 19 show a fourth forming method, in which a bump is formed by evaporation and lift-off. In this case, a photoresist 106 of sheet dry film is used instead of liquid photoresist, in the same manner as in the second bump forming method. Steps up to the window opening for bump formation in the photoresist 106 are the same as those in the second bump forming method.

After the steps, Au layers 113 and Sn layers 123 are alternately formed by evaporation (FIG. 18). Then, unnecessary portions of the Au layers 113 and the Sn layers 123 are lifted off by removing the photoresist 106. Further, the evaporation layers (Ti—W alloy layer 103 and Au contact layer 104) are removed except underneath the bump by chemical etching (FIG. 19).

The evaporation method requires a longer time in formation of layer than the electroplating method, if the thickness is identical. Thus, the evaporation method is inferior in productivity to the electroplating method when it is applied to formation of thicker bump. The two method may be suitably combined in formation of bump. For example, in case of forming a bump made of Au (in thickness of 18 μm):Sn (in thickness of 2 μm), Au layers may be formed by the electroplating method and Sn layers by the evaporation method.

From the invention thus described, it will be obvious that the invention may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor chip comprising:

a semiconductor substrate on which semiconductor elements are formed; and an electrically conductive bump electrically connected with one of said semiconductor elements;

said conductive bump including at least two stacked material structures for softening said entire conductive bump at a predetermined temperature, wherein a first material structure includes, a first layer made of a first metal material and a second layer made of a second metal material and formed directly on said first layer, and a second material structure includes, a first layer made of said first metal material and formed directly on said second layer of said first material structure, and a second layer made of said second metal material and formed directly on said first layer of said second material structure;

said second material is capable of eutectically reacting with said first metal material.

2. A semiconductor chip according to claim 1, further comprising a bonding member located between said semiconductor chip and said conductive bump for joining said bump to said semiconductor chip.

3. A semiconductor chip according to claim 1, wherein said first layer is Au and said second layer is Sn.

4. A wiring connector comprising:

a wiring member electrically connected at a first portion thereof with a semiconductor element formed on a semiconductor chip, said wiring member being formed of a conductor; and a conductive bump electrically connected to said wiring member at a second portion thereof;

said conductive bump including at least two stacked material structures for softening the entire conductive bump at a predetermined temperature, wherein a first material structure includes, a first layer made of a first metal material and a second layer made of a second metal material and formed directly on said first layer, and a second material structure includes, a first layer made of said first metal material and formed directly on said second layer of said first material structure, and a second layer made of said second metal material and formed directly on said first layer of said second material structure;

said second material is capable of eutectically reacting with said first metal material.

5. A wiring connector according to claim 4, further comprising a bonding member located between said conductive bump and said wiring member and said bump for joining said bump to said wiring member.

6. A wiring connector according to claim 4, wherein said first layer is Au and said second layer is Sn.

7. A wiring connector according to claim 4, wherein said wiring member is a printed circuit substrate.

8. A wiring connector according to claim 4, wherein said wiring member is tape in which wiring is formed of a conductor.

9. A semiconductor device comprising:

a semiconductor chip on which semiconductor elements are formed;

a conductive bump formed on and electrically connected to a semiconductor element on said semiconductor chip; and an external electrode electrically connected to said conductive bump;

said conductive bump including at least three stacked eutectic alloy material structures, wherein at least two of said structures include a first material structure having, a first layer made of a first metal material and a second layer made of a second metal material and formed directly on said first layer, and a second material structure having, a first layer made of said first metal material and formed directly on said second layer of said first material structure, and a second layer made of said second metal material and formed directly on said first layer of said second material structure;

said second material having capable of eutectically reacting with said first metal material.

10. A semiconductor device according to claim 9, further comprising a first bonding member provided between said conductive bump and said semiconductor chip for joining said conductive bump to said semiconductor chip.

11. A semiconductor device according to claim 9, further comprising a second bonding member provided between said bump and said external electrode for joining said bump to said external electrode.

12. A semiconductor device according to claim 9, wherein said eutectic alloy is comprised of Au and Sn.

13. A semiconductor device according to claim 9, wherein said external electrode is a wiring member which is formed of a conductor.

14. A semiconductor device according to claim 13, wherein said wiring member is a printed circuit substrate.

15. A semiconductor device according to claim 13, wherein said wiring member is tape in which wiring is formed of a conductor.

* * * * *